United States Patent [19]

Sohlström

[11] Patent Number: 5,603,196
[45] Date of Patent: Feb. 18, 1997

[54] SHIELD WALL STRUCTURE OF A MAGNETICALLY-SHIELDED ROOM AND PROCESS FOR PRODUCING A MAGNETICALLY-SHIELDED ROOM

[75] Inventor: Lasse Sohlström, Eura, Finland

[73] Assignee: Euroshield Oy, Eura, Finland

[21] Appl. No.: 577,970

[22] Filed: Dec. 26, 1995

[30] Foreign Application Priority Data

Dec. 27, 1994 [FI] Finland ................... 946101

[51] Int. Cl.⁶ ................................................. H05K 9/00
[52] U.S. Cl. .................. 52/796.1; 52/173.1; 52/506.05; 52/509; 52/512; 52/515; 174/35 MS
[58] Field of Search ............. 52/796.1, 783.1, 52/787.1, 782.1, 506.01, 506.05, 515, 512, 509, 202, 173.1; 174/34 MS, 35 R

[56] References Cited

U.S. PATENT DOCUMENTS

| | | | |
|---|---|---|---|
| 2,889,698 | 6/1959 | Stevens | 52/515 X |
| 4,561,209 | 12/1985 | Sohlstrom . | |
| 4,753,038 | 6/1988 | Sohlstrom . | |
| 4,806,703 | 2/1989 | Sims | 174/35 MS |
| 4,959,504 | 9/1990 | Yarger et al. | 174/35 MS |
| 5,043,529 | 8/1991 | Vanesky et al. | 174/35 MS |
| 5,335,464 | 8/1994 | Vanesky et al. | 52/173.1 |
| 5,473,111 | 12/1995 | HaHori et al. | 174/35 R |

FOREIGN PATENT DOCUMENTS

| | | |
|---|---|---|
| 63992 | 5/1983 | Finland . |
| 73043 | 4/1987 | Finland . |

*Primary Examiner*—Robert Canfield
*Attorney, Agent, or Firm*—Steinberg, Raskin & Davidson, P.C.

[57] ABSTRACT

A shield wall structure for a magnetically-shielded room and a method for producing a magnetically-shielded room in which the shield wall structure includes at least one shield structure layer, each shield structure layer having a first aluminum sheet layer, a two-ply layer of μ metal sheets, and a second layer of aluminum base sheets. In the aluminum sheet constituting the first layer, holes are made at a hole spacing equivalent to the width of the μ metal sheets. Support members are disposed in the holes. The first layer of μ metal sheets is suspended, supported on the support members, and on top of these, the second layer of μ metal sheets is suspended by the support members in another direction. On top of the two-ply μ metal sheet structure, the base sheets of aluminum are positioned in conjunction with the support members. Tightening members are then coupled to the support members for operatively compressing the entire wall structure into a compact package.

10 Claims, 2 Drawing Sheets

SHIELD WALL STRUCTURE OF A MAGNETICALLY-SHIELDED ROOM AND PROCESS FOR PRODUCING A MAGNETICALLY-SHIELDED ROOM

FIELD OF THE INVENTION

The present invention relates to a shield wall structure of a magnetically-shielded room, comprising at least one shield wall structure wherein each shield structure layer comprises a first aluminum sheet layer, a two-ply layer made from μ metal sheets, and a second layer made from aluminum layers.

The present invention also relates to a process for producing a magnetically-shielded room, the shield wall structure of the room comprising at least one shield structure layer wherein each shield structure layer comprises a first layer made from aluminum sheets, a two-ply layer made from μ metal sheets, and a second layer made from aluminum sheets.

BACKGROUND OF THE INVENTION

For providing an interference-shielded space, the function of the structures used to house the space can be to prevent penetration of external electromagnetic energy into the shielded space or also to limit the electromagnetic energy within a space surrounded by the structure by preventing leakage of an interfering field into the surroundings. Structures of this type are known in the art and they are generally used for shielding sensitive structures against electromagnetic radiation and for enabling measurements free of radio frequency interferences, e.g., in industries employing data transmission and high frequency technology, in research, and, e.g., in hospitals. Irrespective of the use of the shielded space, the most poorly absorbing part in the shielding is usually formed by the contact point between a door, window, hatch or equivalent element to be opened for access into the shielded space and the fixed structure.

To avoid the deterioration if the shielding properties of the door, the electric contact of the moving part of the door and the door frame, and the redundance path, when shielding against low-frequency magnetic field, is required to be as continuous as possible and correspond to the properties of the rest of the structure. The absorption properties of the joint between the door and the frame can be improved, above all at high frequencies, with a labyrinth structure positioned at the point of contact where, for ensuring the contact, knife-like contact tongues are pressed between the contact springs disposed in a runner running around the aperture.

However, in prior art door designs, the performance values achieved in practice have been limited by the fact that using a repeated labyrinth structure has not been possible, because of the requisite tight fits, so that the normal convenience of use of the door and the operation properties of a door hinged in a normal way are maintained. When an efficient and complicated labyrinth structure is used, the contact tongues penetrating between the springs tend to, owing to the tight fits, damage the sealing structure by urging the sealing springs off from their locations by means of the swivelling movement of a normally turning door, and on the other hand, closing such door requires enormous press force, e.g., from about 100 kp to about 150 kp.

Finnish Patent No. 63992, corresponding to U.S. Pat. No. 4,561,209 incorporated by reference, discloses a door in a structure intended for prevention of the transmission of interference fields in which the movement of the door is provided by a rotary movement around an axis determined by hinge means and by a substantially rectilinear movement producing a contact which prevents transmission of interference fields. It has, however turned out to be that, particularly in large-size door designs, the rotary movement around the axle is not the best possible solution. In such instances, the heavy weight of the door poses high requirements on the hinge means. Thus, the large forces and torques directed at the rotary hinging of the heavy door structure create more stress in the hinging than in light-weight door structures.

Finnish Patent No. 73043, corresponding to U.S. Pat. No. 4,753,038 incorporated by reference, discloses a door in a structure to prevent transmission of interference fields, particularly high-frequency electromagnetic fields, relative to which the door has been arranged to be moved with hinge means and whereby the door and/or fixed structure has/have been provided with members to have a contact between the door and the fixed structure to prevent the transmission of interference fields. The door has been arranged to move with the aid of first hinge means substantially rectilinearly in a direction which is in the direction of the normal to the plane of the door, and with the aid of second hinge means substantially in the direction of the plane of the door. The first hinge means comprise first coupling means and second coupling means, either of which having been disposed to move while in contact with the cooperative coupling means. The first coupling means consist of a toothed wheel and the second coupling means consist of a pinion rack, whereby the toothed wheel has been arranged to move along the teeth of the rack. The second hinge means comprise rollers supported by which the door has been arranged to move on a guide bar.

The interferences inhibiting precise magnetic measurements can be classified into two groups: those caused by humans and those cause by nature, such as the magnetic field of the earth. When moving far off from the sphere influenced by the humans, an environment is created in which the disturbances caused by humans are insignificant. In general, it is desirable to make measurements in a laboratory environment. Now, powerful interferences are caused, among other things, by lifts or elevators, vibrations of the constructional steels, passing vehicles, and electric apparatus. In a magnetically-shielded room, endeavors are made to absorb interferences of the laboratory surroundings to the extent that research applying the most sensitive measurement devices is possible in the "inner interiors" of the room.

Magnetic shielding is implemented utilizing three different methods. These are as follows: passive ferromagnetic shielding, swirl shielding, and active compensation of the interference field. The ferromagnetic shielding consists of one or more nested μ metal shells. Each wall is made of two μ metal layers, the metal strips of which are positioned, e.g., cross-wise. The μ metal layers have been mounted between two aluminum sheets (having thicknesses of, e.g., 2 mm and 5 mm). The 5 mm aluminum sheets serving as the support structure have been joined to each other to form a uniform structure conducting electricity well. In such a structure, the inducing swirls absorb the alternating current magnetic field which is trying to enter the interior. An active shielding is implemented with coils installed around the magnetic-shielded room, to which the electric current is conducted, the magnetic field generated by which is as great within the magnetic-shielded room but reverse in direction as the external interfering magnetic field trying to enter the room. The active shielding is efficient at low frequencies and its shielding capacity is limited merely by the noise of the magnetometers and electronic apparatus used.

The properties of passive ferromagnetic shielding may be enhanced considerably by superposing a relatively large alternating current magnetic field ($H_s$=5 A/m, rms) into an interference, whereby the effective permeability of the µ metal increases significantly, thus causing an increase in the shielding factor. In modern English, this type of processing is called "shaking".

It is possible to shield against static and slowly varying magnetic fields on a large scale merely by building the walls of the space to be shielded from µ metal or by using active compensation of the magnetic field. A material of high permeability can be thought of acting as a good conductor concerning a magnetic field and shielding the space enclosed therewith by conducting the fields into itself. The shielding factor of the ferromagnetic shell is proportional to the permeability of the material and the thickness of the shell layer. By building a multiple-layer shield, a higher shielding factor can be obtained with the same quantity of material than by using one single screen of the same weight.

Shaking or superposing alternating current magnetic field on the walls of the shield has clearly been found to improve the shielding factor. The effective permeability of the µ metal has been found to be improved with shaking treatment into twice to seven times greater in 0 to 100 Hz frequency range. The shaking frequency can in practice be varied in the range 3 to 200 Hz. The most useful frequency is in general the 50 Hz mains frequency because the shaking causes a relatively strong interference field in a shielded space. On the mains frequency, the interference level has already been high, and preparations have to be made in any case to absorb the interferences, e.g. using filtering in the measurement apparatus. The shielding factor has been found to be improved both at interference frequencies above and below the shaking frequency.

If the walls of the shielded space have been built from a conductive material, the swirls produced in the shielding shell absorb the varying interference field within the room. It goes without saying that the static field is not affected by the swirl shielding at all. The swirls commence to exert their effect at frequencies at which the penetration depth of an interference field is of the order of the thickness of the shielding shell. As the frequency increases, the shielding factor caused by the swirls increases exponentially. The upper limit of the shielding factor is determined by the field entering the room through apertures and joints.

Active compensation apparatus of magnetic fields are used in a multitude of applications, not however in general in combination with passive shielding methods. The magnitude of an interference magnetic field is measured at a distance from the target to be shielded, with the purpose that the magnetic field produced by the compensation coil would have no effect on the measurement. The current of the compensation coil is controlled with a precise current generator so that it is directly proportional to the interference field being measured. An interference field may also be measured at a number of points, and the current of the compensation coils can be controlled according to the appropriately weighted mean of the measurement values.

If, in a magnetic shielding using merely active compensation, the interference magnetic field is measured in the proximity of a shielded space or therewithin, also the magnetic field being studied is compensated in addition to the interference field so that the closed control of the current of the compensation coils is not functional.

When active compensation is used in conjunction with passive magnetic shielding, a closed control of the current of the compensation coil is conceivable.

The current of the compensation coil is controlled by a closed control circuit which tends to maintain the measured magnetic field constant. After the measured magnetic field is stabilized, also the residual field prevailing in the magnetic-shielded space is constant.

In practice, the residual field cannot be turned completely into a constant field because the magnetic field provided by the compensation coil is not homogeneous in the shielded space.

When estimating the shielding factor of a magnetic-shielded room, three situations and shielding mechanisms differing from each other can be identified:

(a.) Shielding caused by a ferromagnetic material to the static field of the earth, that is, the static shielding.

(b.) Shielding caused by a ferromagnetic material against slowly varying interference fields (f<1 Hz), that is, so-called quasistatic shielding.

(c.) Combined effect of swirls and ferromagnetic shielding with increased frequency (f>1 Hz), that is, dynamic shielding.

The above frequency limits are exemplary and dependent on the thickness of the walls of the shield and the materials used.

A magnetically-shielded room and a door structure to be positioned in the door aperture thereof is required to possess specific properties, in order to have a sufficient shielding factor. A magnetically-shielded room is in general built as follows. The room is assembled from separate wall elements to be joined, and the magnetic contact between the wall elements is ensured with the aid of µ metal corner pieces installed on the lateral edges. The magnetically-shielded room can be erected preferably in a volume reserved for it, most preferably on concrete pillars cast on the bedrock so that the walls and the inner floor are mechanically either separated or joined.

The wall elements are built to be supported by an aluminum support structure. The different layers of the wall element from the outside to the inside are as follows: support structure profile, one 5 mm aluminum sheet, two 1 mm µ metal sheets and one 2 mm aluminum sheet. The thickness of one wall element with the support structure can be about 175 mm. The elements are assembled by joining the aluminum and µ metal sheets into one package. The wall sheets are mounted on the support structure.

The walls, the floor and the ceiling are joined together by welding the innermost 5 mm aluminum sheets of the elements into one. Thereafter, in order to provide good magnetic contact for the edges, two pieces of 1 mm µ metal corner lists are attached on top of each other outside the walls, and as a support, a 4 mm aluminum corner list. The corner lists are secured by riveting. Thereafter, the support structures of the elements are connected to each other with corner clamps, which are welded in place. The walls are assembled element by element, starting from the innermost layer, and mounted on the lower layer with bolts.

The inner floor of the magnetic-shielded room is built to stand supported by an aluminum framework supported by the legs mounted directly onto the concrete base. Thus, the floor will not be in direct contact with the walls of the room. In this regard, efforts are made to minimize the vibration of the walls. For the floor material, timber is in general used, and the floor is usually assembled from plates which are easy to move away from the room.

In the technology known in the art for producing magnetically-shielded rooms, one of the most significant drawbacks is the manner in which holes are bored for the rivets needed in the shield wall structure. Since the boring is made through the entire laminated structure, the permeability of the μ metal sheets is greatly weakened and therethrough, respectively weakening the shielding factor of the magnetic-shielded room.

OBJECTS AND SUMMARY OF THE INVENTION

Accordingly, it is an object of the present invention to provide an improvement in the wall structures of magnetically-shielded rooms.

It is another object of the present invention to provide a new and improved method for producing a magnetically-shielded room so that the harmful weakening of the permeability of the μ metal sheets is avoided.

In order to achieve the objects set forth above and others, the shield wall structure of the magnetically-shielded room according to the present invention comprises an aluminum sheet which forms the first layer and includes holes at a set distance which is equivalent to the width of the μ metal sheets, and support members inserted in the holes. A first layer of substantially elongate μ metal sheets is suspended, supported by the support members, and thereon, a second layer of μ metal sheets in another direction, i.e., the longitudinal direction of the metal sheets in the first and second layers is different. On top of the two-layer μ metal sheet structure, base sheets made of aluminum are positioned around the support members. Tightening members are positioned in conjunction with the support members to operatively compress the entire wall structure into a compact package.

The method according to the present invention for producing a magnetically-shielded room comprises the following steps:

(a.) in the aluminum sheet structure forming the first layer, holes are made at a set hole distance which is equivalent to the width of the μ metal sheets;

(b.) support members are inserted in the holes;

(c.) a first layer of μ metal sheets is suspended on the support members;

(d.) a second layer of μ metal sheets is suspended in another direction on top of the μ metal sheets forming the first layer;

(e.) aluminum base plates are disposed in the support members on top of the two-ply μ metal sheet structure; and (f.) press members are disposed in conjunction with the support members for operatively compressing the entire wall structure into a compact package.

Using the shield wall structure of a magnetically-shielded room and procedure for producing a magnetically-shielded room according to the invention, several remarkable advantages are realized in comparison with the state of art. The design according to the invention makes it possible that at least one shield layer can in general be omitted from the shield structure layers of the shield wall structure without impairing the shielding factor of the magnetically-shielded room because the permeability of the μ metal sheet structure is not substantially impaired. In addition, with the design of the invention the installation work is greatly accelerated and facilitated. A shield wall structure according to the invention can also be readily dismounted and moved to a new operating site.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
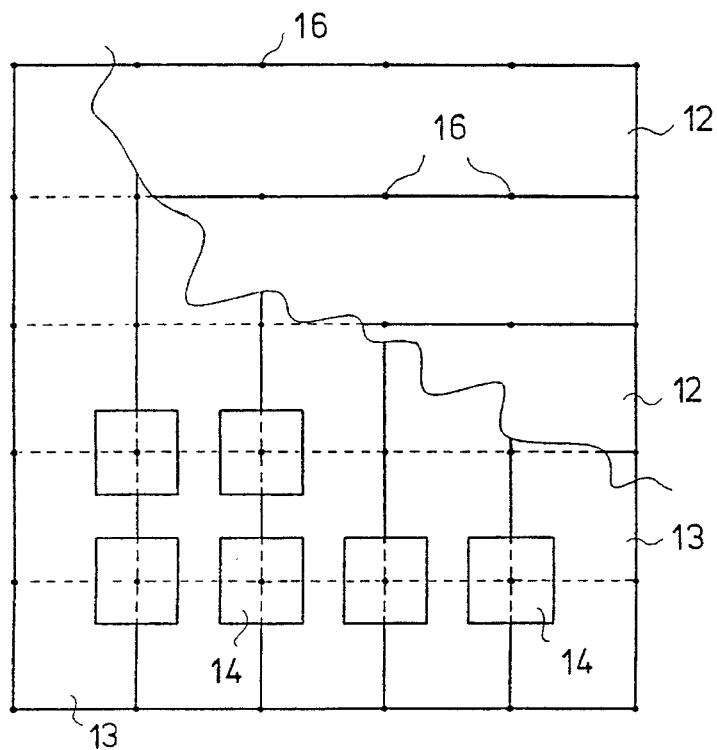
FIG. 1 shows a from view of a wall structure in accordance with the invention in a production step in which μ metal sheets are positioned cross-wise one on top of the other.

Referring to the accompanying drawings wherein the same reference numerals refer to the same or similar elements, in the embodiment shown in FIGS. 1–5, a magnetically-shielding wall structure comprises a sheet of 5 mm width aluminum sheet 11 including holes 15 bored therein at a set distance which is equivalent to the width of a pair of μ metal sheets 12,13 which overlie the aluminum sheet 11. If the width of the μ metal sheet is, e.g., 600 mm, the holes 15 are bored in the aluminum sheet 11, starting in the middle of the room to be magnetically shielded at 600 mm hole spacing. The holes 15 are spaced from one another in perpendicular directions.

Figure 2:
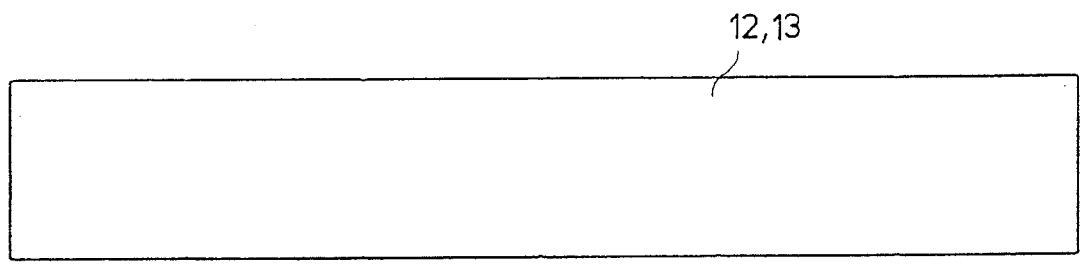
FIG. 2 shows a front view of a μ metal sheet used in the wall structure in accordance with the invention.
Figure 3:
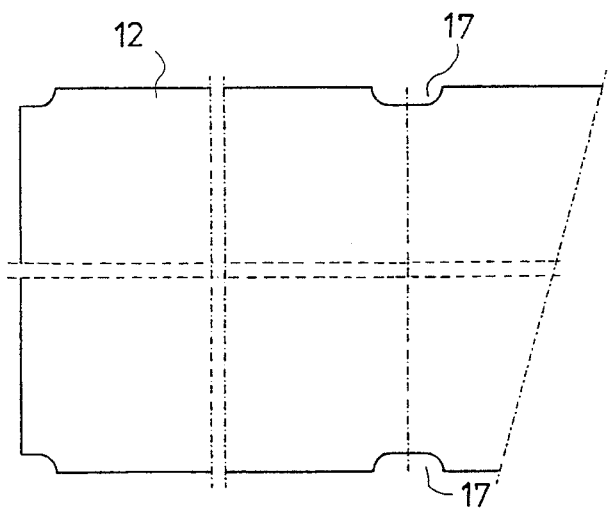
FIG. 3 shows a part of the μ metal sheet of FIG. 2 treated in the manner of the invention in an enlarged scale.
Figure 4:
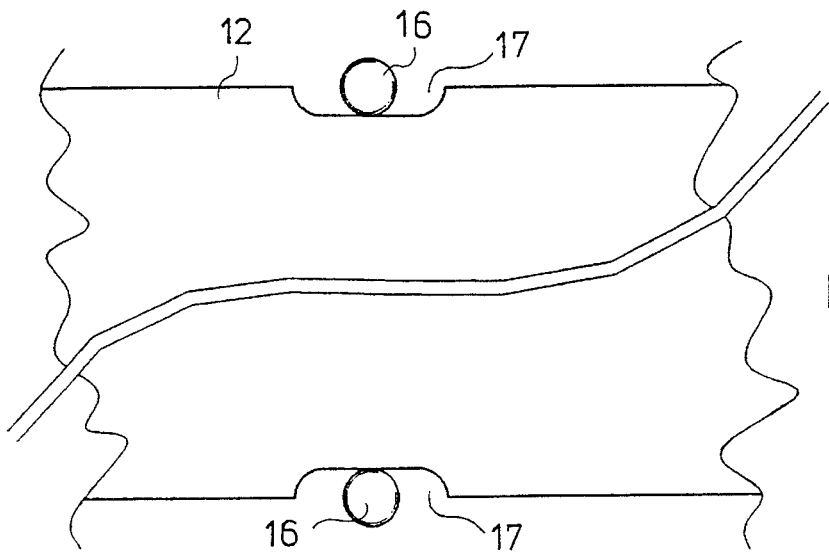
FIG. 4 shows a front view of part of the μ metal sheet of FIG. 3 suspended to the support members.
Figure 5:
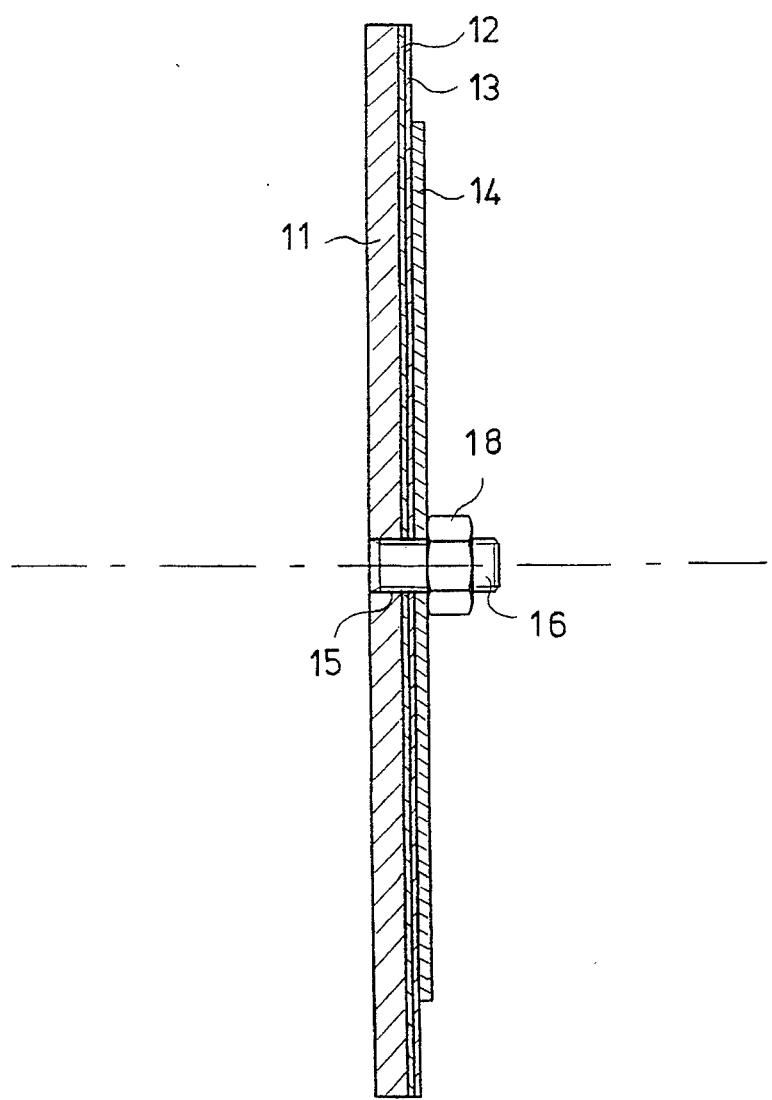
FIG. 5 shows a fastening point of a wall structure in accordance with the invention.

The μ metal sheets 12 and 13 are substantially rectangular shaped as shown in FIG. 2 but material is removed from both lateral edges of the sheets 12,13 at a set spacing distance to form indentations 17 on the lateral edges of the sheets 12,13 (FIG. 3). Indentations 17 are produced advantageously, e.g., by cutting so that the cutting will not essentially change the permeability of the μ metal sheets 12,13. Thus, the distance between the arcuate indentations 17 will be substantially equal to the distance between adjacent holes 15.

The wall structure is assembled as follows. In the holes 15 bored in the aluminum sheet 11, support members 16 are attached, such as bolts made from stainless steel and having a threaded part. Thereafter, a first layer of μ metal sheets 12 are suspended on the support members 16, and thereupon, a second layer of μ metal sheets 13 are suspended on the support members 16 in another direction, e.g., cross-wise, so that the longitudinal direction of sheets 12 is perpendicular to the longitudinal direction of sheets 13 (FIG. 1). Then, on top of the μ metal sheet structure 12,13 of two-ply structure, aluminum base sheets 14 are positioned on the support members 16. Sheets 14 are square and extend for a distance from the support member 16 (FIG. 1). Finally, locking means or tightening means such as nuts 18 are attached to the threaded part of the steel bolts 16 and, by rotating the nuts in the appropriate direction, the entire wall structure is compressed into a compact package. The size of the aluminum base sheets 14 is so selected that the wall structure 11,12,13,14 can be compressed into a compact package.

In the foregoing, merely the principle design of the invention is described, and it is obvious to a person skilled in the art that a multitude of modifications can be made within the scope of the inventive idea presented in the accompanying claims.

The examples provided above are not meant to be exclusive. Many other variations of the present invention would be obvious to those skilled in the art, and are contemplated to be within the scope of the appended claims.

I claim:

1. A shield wall structure for a magnetically-shielded room, comprising
   a first aluminum layer having holes therein at a set distance from each other,
   support members positioned in respective ones of said holes,
   first and second µ metal sheet layers, said first and second metal sheet layers comprising a plurality of elongate sheets of µ metal, the set distance between said holes in said first aluminum layer being substantially equal to a width of said metal sheets, said metal sheets in said first metal sheet layer being supported by said support members adjacent said first aluminum layer, said metal sheets in said second metal sheet layer being supported by said support members adjacent said first metal sheet layer and such that the longitudinal direction of said metal sheets in said second metal sheet layer is different than the longitudinal direction of said metal sheets in said first metal sheet layer,
   aluminum base sheets supported by said support members adjacent said second metal sheet layer, and
   tightening means cooperating with said support members for pressing said aluminum base sheets against said second metal sheet layer to compress said first and second metal sheet layers between said first aluminum layer and said aluminum base sheets.

2. The shield wall structure of claim 1, wherein said metal sheets in said first and second metal sheet layers have indentations in the longitudinal sides thereof, the distance between adjacent indentations being substantially equal to the set distance between said holes in said first aluminum layer.

3. The shield wall structure of claim 1, wherein said support members are bolts having a thread and said tightening means are nuts having a thread cooperating with the thread of said bolts.

4. The shield wall structure of claim 1, wherein the width of said metal sheets in said first and second metal sheet layers is about 600 mm, such that the set distance in said holes in said first aluminum layer is about 600 mm.

5. The shield wall structure of claim 1, wherein the size of said aluminum base sheets is selected such that said tightening means compress said aluminum base sheets, said first and second metal sheet layers and said first aluminum layer into a compact package.

6. The shield wall structure of claim 1, wherein the longitudinal direction of said metal sheets in said second metal sheet layer is perpendicular to the longitudinal direction of said metal sheets in said first meal sheet layer.

7. A method for producing a magnetically-shielded room, comprising the steps of:
   forming holes in a first aluminum sheet layer at a set distance,
   positioning support members in respective ones of said holes,
   suspending a first layer of elongate µ metal sheets on said support members,
   suspending a second layer of elongate µ metal sheets on top of said first layer of µ metal sheets such that the longitudinal direction of said metal sheets in said second metal sheet layer is different than the longitudinal direction of said metal sheets in said first metal sheet layer, and
   pressing aluminum base sheets against said second metal sheet layer to press said first and second metal sheet layers against said first aluminum layer.

8. The method of claim 7, further comprising the step of removing material from longitudinal edges of said elongate metal sheets in said first and second metal sheet layers at locations spaced from one another by a distance corresponding to the distance between adjacent holes in said first aluminum layer.

9. The method of claim 7, wherein the width of elongate said metal sheets in said first and second metal sheet layers is about 600 mm and the distance between adjacent ones of said holes is about 600 mm.

10. The method of claim 7, further comprising the step of selecting the size of said aluminum base sheets such that the wall structure is compressible into a compact package.

* * * * *